United States Patent
Liang

(10) Patent No.: US 8,746,817 B2
(45) Date of Patent: Jun. 10, 2014

(54) ELECTRONIC DEVICE AND CASE STRUCTURE THEREOF

(75) Inventor: Chen-Yi Liang, Taipei (TW)

(73) Assignee: Wistron Corporation, New Taipei (TW)

( * ) Notice: Subject to any disclaimer, the term of this patent is extended or adjusted under 35 U.S.C. 154(b) by 51 days.

(21) Appl. No.: 13/599,126

(22) Filed: Aug. 30, 2012

(65) Prior Publication Data

US 2013/0119836 A1 May 16, 2013

(30) Foreign Application Priority Data

Nov. 11, 2011 (TW) .............................. 100221311 U

(51) Int. Cl.
*A47B 97/00* (2006.01)
*H05K 5/02* (2006.01)

(52) U.S. Cl.
USPC .................................. 312/223.1; 361/679.58

(58) Field of Classification Search
CPC ......... G06F 1/181; G06F 1/184; G06F 1/185; G06F 1/186; G06F 1/187; G11B 33/124; A47B 2200/07
USPC ..................... 312/223.1, 223.2, 257.1, 265.6; 361/679.02, 679.55, 679.58
See application file for complete search history.

(56) References Cited

U.S. PATENT DOCUMENTS

| | | | | |
|---|---|---|---|---|
| 5,331,506 A | * | 7/1994 | Nakajima | ................ 361/679.58 |
| 7,679,904 B2 | * | 3/2010 | Tang | ........................ 361/679.58 |
| 7,872,860 B2 | * | 1/2011 | Tang | ........................ 361/679.01 |
| 2007/0087263 A1 | * | 4/2007 | Ge et al. | .......................... 429/97 |
| 2010/0081045 A1 | * | 4/2010 | Li | ................................ 429/100 |

* cited by examiner

*Primary Examiner* — James O Hansen
(74) *Attorney, Agent, or Firm* — Muncy, Geissler, Olds & Lowe, P.C.

(57) ABSTRACT

A case structure of an electronic device includes a main case, a cover, and an elastic driving element. The main case includes a hollow portion, and a spring leaf structure protruding inwardly from a side of the hollow portion. The cover for covering the hollow portion includes a fastening portion, at least one fixing element, and a column portion. The elastic driving element is movably combined with the main case and includes a corresponding fastening portion and an operating portion. When the cover is combined with the main case, the spring leaf structure is pressed by the column portion to generate an elastic deformation; when the operating portion is moved to let the corresponding fastening portion detach from the fastening portion, the cover may detach from the main case with an elastic restoring force exerted by the spring leaf structure on the column portion.

7 Claims, 4 Drawing Sheets

ELECTRONIC DEVICE AND CASE STRUCTURE THEREOF

BACKGROUND OF THE INVENTION

1. Field of the Invention

The present invention relates to a case structure for an electronic device, and more particularly, to a case structure having a cover fixed to the case structure without using any screw.

2. Description of the Related Art

Generally, a common electronic device, such as a notebook computer or a tablet PC, is implemented with a removable cover on the back of its case for the user to conveniently remove the cover to replace the components and battery of the electronic device. The removable cover is usually fixed to the case by using a screw or by using a screw combined with a hitching structure. However, the addition of the screw has both increased the complexity and the time in assembling and detaching the electronic device for the user; besides, it introduces more cost to the element of the electronic device.

Therefore, it is desirable to provide a removable cover which is fixed to the electronic device without using any screw and is also easy to be removed by the user.

SUMMARY OF THE INVENTION

It is an object of the present invention to provide a case structure of an electronic device in which a cover is fixed to the case structure without using any screw.

In order to achieve the above object, the present invention discloses a case structure of an electronic device, which comprises a main case, a cover, and an elastic driving element. The main case comprises a hollow portion and a spring leaf structure, wherein the spring leaf structure protrudes inwardly from a side of the hollow portion. The cover is combined with the main case to cover the hollow portion. The cover comprises a body, a fastening portion, at least one fixing element, and a column portion, wherein the at least one positioning element and the fastening portion are disposed at two opposite sides of the body respectively, and the column portion is disposed on the body to correspond to the spring leaf structure. The elastic driving element is movably combined with the main case, and the elastic driving element comprises a corresponding fastening portion and an operating portion. The elastic driving element is disposed with respect to the fastening portion; and an operating portion, wherein the operating portion is movable to drive the corresponding fastening portion along with the operating portion. The cover is combined with the main case by the at least one fixing element being fastened to the main case and by the fastening portion being fastened with the corresponding fastening portion; wherein the spring leaf structure is pressed by the column portion to generate an elastic deformation; when the cover is combined with the main case, the operating portion is movable to let the corresponding fastening portion detach from the fastening portion, then the cover may detach from the main case with an elastic restoring force exerted by the spring leaf structure on the column portion.

Therefore, the user can apply an external force to the operating portion to let the cover detach from the main case with the elastic restoring force, and the user can easily put the cover and the main case together without any additional tool, thereby enhancing the usability of the electronic device.

DETAILED DESCRIPTION OF THE PREFERRED EMBODIMENT

The advantages and innovative features of the invention will become more apparent from the following detailed description when taken in conjunction with the accompanying drawings.

The present invention discloses a case structure of the electronic device which is applicable to portable computers (such as notebook, netbook, tablet PC), smart phone, personal digital assistant (PDA), or any other electronic device which comprises a removable cover.

Figure 1:
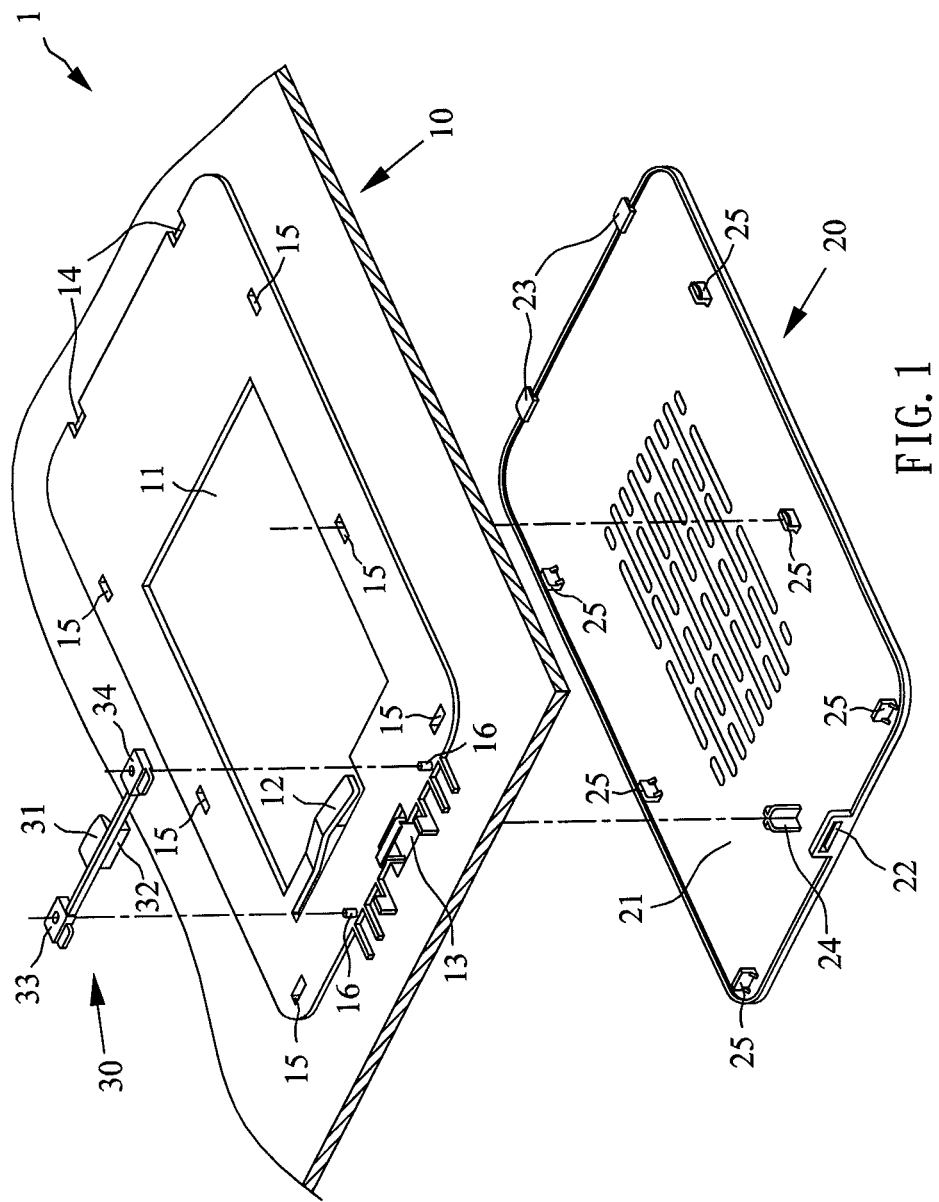
FIG. 1 illustrates an explosive view of a case structure of an electronic device of the present invention.

Please refer to FIG. 1 for an explosive view of a case structure of an electronic device of the present invention. As shown in FIG. 1, the present invention provides a case structure 1 of an electronic device, which comprises a main case 10, a cover 20, and an elastic driving element 30. The main case 10 comprises a hollow portion 11, a spring leaf structure 12, a receiving hole 13, and at least one positioning hole 14, the spring leaf structure 12 extends from one side of the hollow portion 11 and protrudes inwardly, the receiving hole 13 and the at lest one positioning hole 14 are disposed at two opposite sides of the hollow portion 11. Furthermore, the main case 10 further comprises a plurality of through holes 15 disposed at an outer perimeter of the hollow portion 11 for fixing the cover 20 to the main case 10.

The cover 20 is combined with the main case 10 to cover the hollow portion 11. The cover 20 comprises a body 21, a fastening portion 22, at least one positioning element 23, and a column portion 24. The fastening portion 22 and the at least one positioning element 23 are disposed at two opposite sides of the body 21 respectively, wherein the fastening portion 22 corresponds to a receiving hole 13 of the main case 10, and the at least one positioning element 23 corresponds to the at least one positioning hole 14 of the main case 10; therefore, when the cover 20 is combined with the main case 10, the cover 20 may be fixed to the main case 10 by the fastening portion 22 and the at least one positioning element 23 respectively. The column portion 24 is disposed on the body 21 to correspond to the spring leaf structure 12, so when the cover 20 is combined with the main case 10, the column portion 24 may go through the hollow portion 11 in the main case 10 to make contact with and to press the spring leaf structure 12. In this embodiment, the fastening portion 22 is a structure having a fastening hole, and the at least one positioning element 23 can be a bump or a hitch, but the fastening portion 22 and the at least one positioning element 23 can be any other fastening structure. Besides, the cover 20 further comprises a plurality of hitching elements 25 disposed at a perimeter of the body 21 and corresponded to the plurality of through holes 15 of the main case 10 for fixing the cover 20 to the main case 10.

The elastic driving element 30 is movably combined to the main case 10. The elastic driving element 30 comprises a corresponding fastening portion 31, an operating portion 32, a first end 33, and a second end 34. The corresponding fastening portion 31 and the operating portion 32 are disposed between the first end 33 and the second end 34, and the first end 33 and the second end 34 are both fixed to the main case 10. The corresponding fastening portion 31 is disposed correspondingly to the fastening portion 22 of the cover 20; the operating portion 32 corresponds to the receiving hole 13 of the main case 10.

Figure 2:
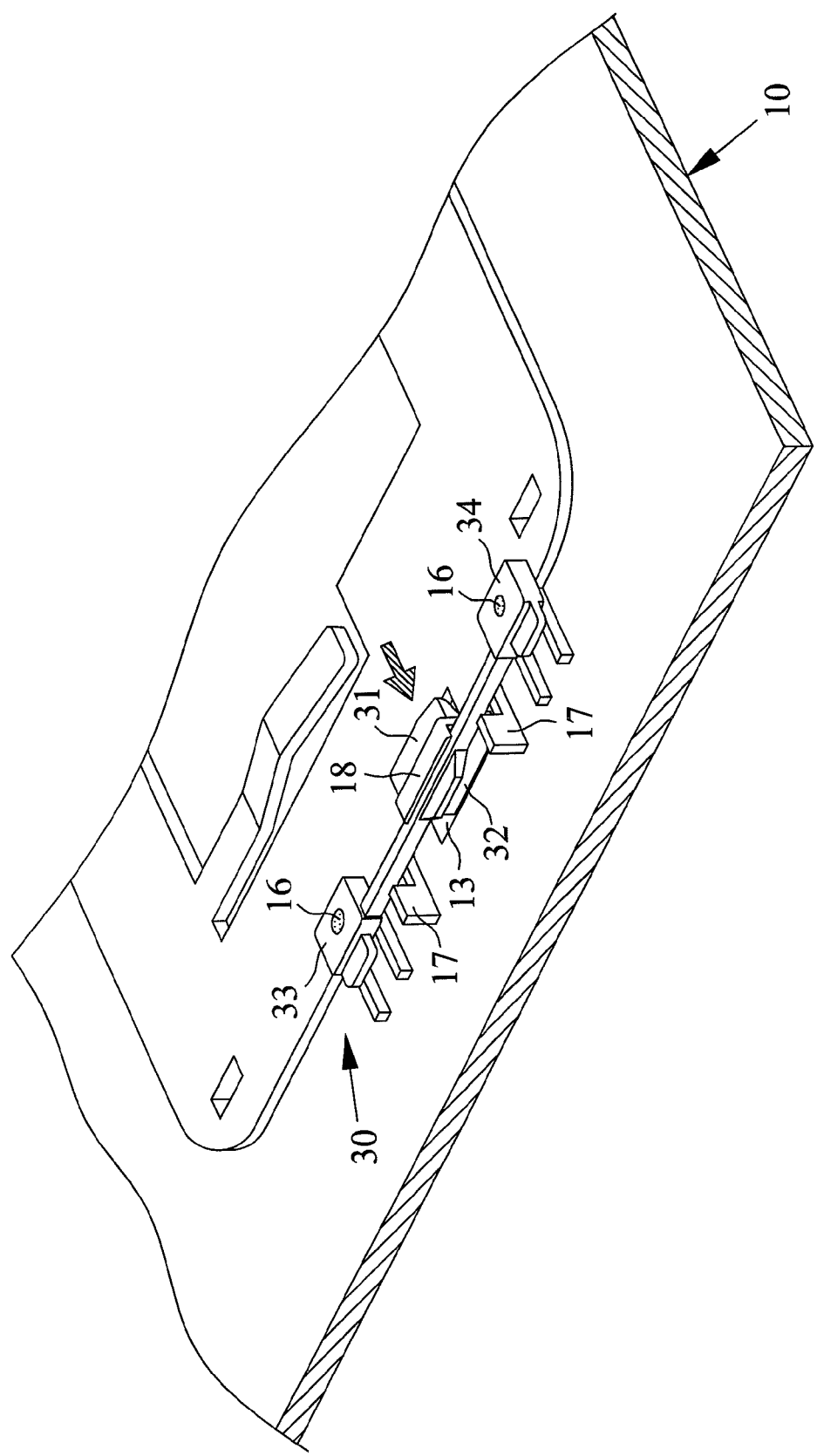
FIG. 2 illustrates a view of the case structure of the electronic device using an elastic driving element to combine with the main case.

Please also refer to FIG. 2 for a view of the case structure of the electronic device using an elastic driving element 30 to combine with the main case 10. As shown in FIG. 1 and FIG. 2, when the elastic driving element 30 is combined with the main case 10, the operating portion 32 of the elastic driving element 30 can protrude through the receiving hole 13 of the main case 10 for the user to operate the operating portion 32. In this embodiment, the main case 10 has two hot melt columns 16 penetrated through the first end 33 and the second end 34 of the elastic driving element 30, and then the two hot melt columns 16 are hot melted to fix the first end 33 and the second end 34 of the elastic driving element 30 to the main case 10. Therefore, when the user applies an external force to the operating portion 32, the elastic driving element 30 may be moved and generate an elastic deformation (along the direction of the arrow drawn with slashes in FIG. 2); besides, moving the operating portion 32 will drive the corresponding fastening portion 31 along with the operating portion 32.

Additionally, the main case 10 further comprises at least one retaining structure 17 disposed on a path of the elastic deformation of the elastic driving element 30 to limit a moving distance of the elastic driving element 30 to prevent excessive deformation. The main case 10 further comprises a position limiting structure 18 for limiting a moving direction of the operating portion 32 to prevent deformation of the operating portion 32 caused by the external force.

Figure 3:
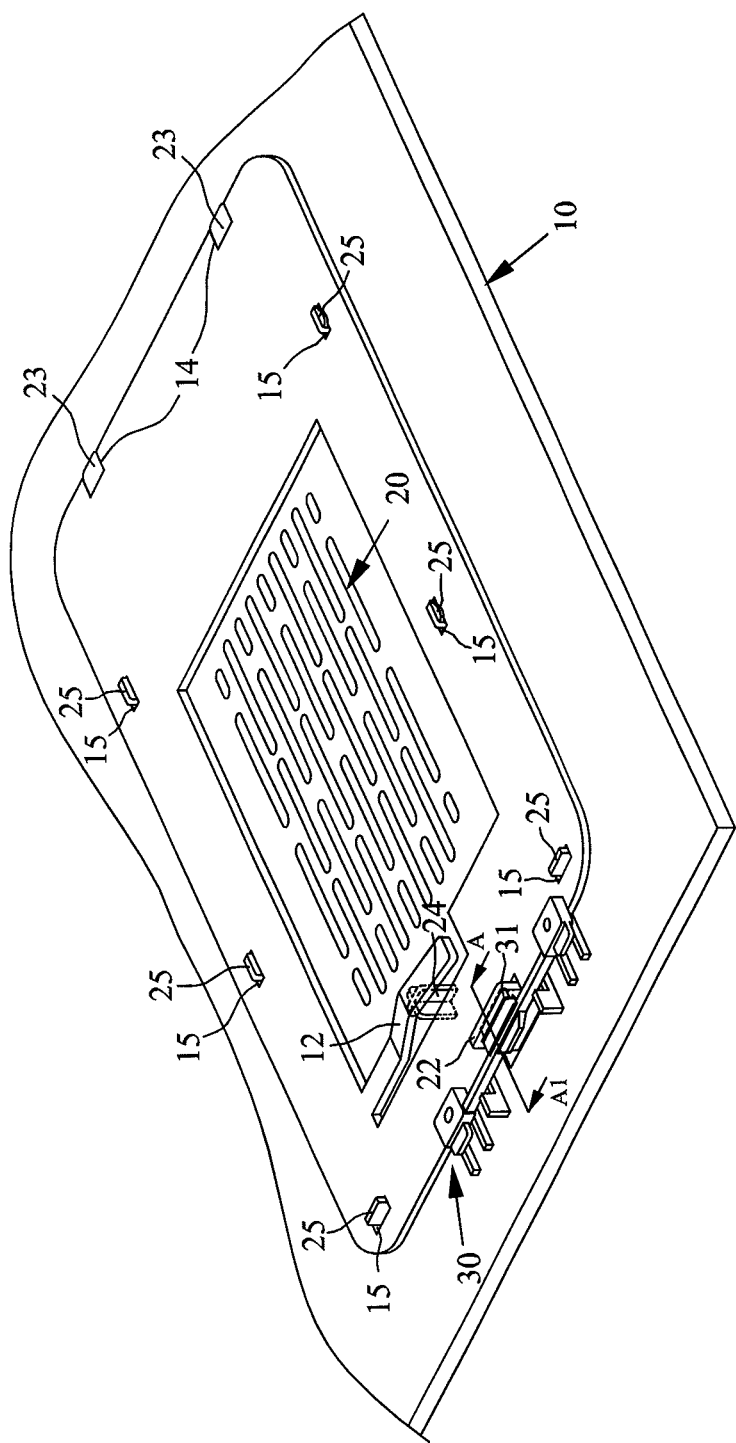
FIG. 3 illustrates a view of the case structure of the electronic device using a cover to combine with the main case.

Please also refer to FIG. 3 for a view of the case structure of the electronic device using the cover 20 to combine with the main case 10. As shown in FIG. 1 and FIG. 3, after the elastic driving element 30 is combined with the main case 10, the cover 20 can be combined with the main case 10. At first the cover 20 forms an angle with respect to the main case 10 to allow the at least one positioning element 23 to be fastened with the at least one positioning hole 14 of the main case 10; then the side of the body 21 which is disposed with the fastening portion 22 is pushed towards the main case 10 until the fastening portion 22 of the cover 20 is fastened with the corresponding fastening portion 31 of the elastic driving element 30, thereby combining the cover 20 and the main case 10. Meanwhile, the spring leaf structure 12 is pressed by the column portion 24 to generate an elastic deformation. Besides, the plurality of through holes 15 of the main case 10 are mutually fastened with the plurality of hitches 25 of the cover 20 to increase the fix effect between the cover 20 and the main case 10.

Figure 4A:
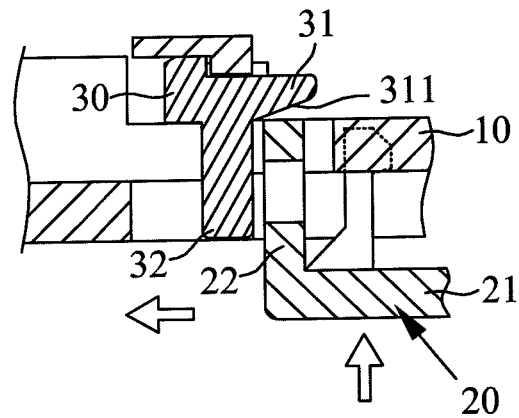
FIG. 4(a) illustrates a view of the case structure of the electronic device before the cover is combined with the main case.
Figure 4B:
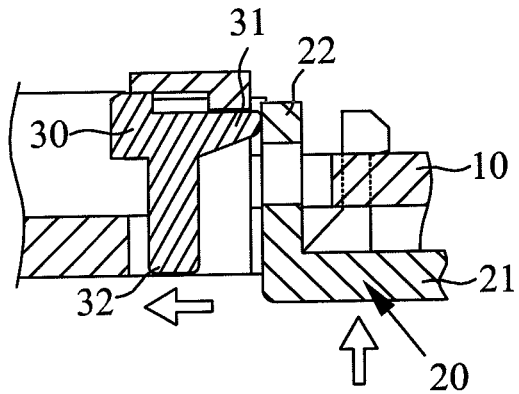
FIG. 4(b) illustrates a view of the case structure of the electronic device during the process of the cover combining with the main case.
Figure 4C:
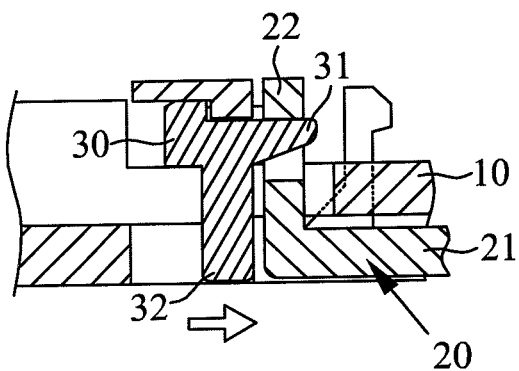
FIG. 4(c) illustrates a view of the case structure of the electronic device after the cover is combined with the main case.

In the following, please refer to FIG. 4(a), FIG. 4(b), and FIG. 4(c) all together. FIG. 4(a) illustrates a partially sectional view of the case structure of the electronic device before the cover 20 is combined with the main case 10; FIG. 4(b) illustrates a partially sectional view of the case structure of the electronic device during the process of the cover 20 combining with the main case 10; FIG. 4(c) illustrates a partially sectional view of the case structure of the electronic device after the cover 20 is combined with the main case 10. FIG. 4(a), FIG. 4(b), and FIG. 4(c) are illustrated along the A-A1 line in FIG. 3.

As shown in FIG. 4(a), the corresponding fastening portion 31 of the elastic driving element 30 comprises an inclined plane structure 311. When the side of the body 21 which is disposed with the fastening portion 22 is pushed towards the main case 10, the top of the fastening portion 22 will move along with the body 21 to gradually approach and make contact with the inclined plane structure 311 of the corresponding fastening portion 31, so the corresponding fastening portion 31 is pressed to move along the direction of the arrow. As shown in FIG. 4(b), after the corresponding fastening portion 31 of the elastic driving element 30 moves completely out of the moving path of the fastening portion 22, the fastening portion 22 will continue move in the same direction, meanwhile, the corresponding fastening portion 31 is stopped by the fastening portion 22. As shown in FIG. 4(c), after the fastening portion 22 moves to a position where the fastening hole of the fastening portion 22 corresponds to the corresponding fastening portion 31, the corresponding fastening portion 31 is no longer stopped by the fastening portion 22 and will move towards the through hole of the fastening portion 22 with an elastic restoring force provided by the elastic driving element 30, thereby fastening the fastening portion 22 and the corresponding fastening portion 31.

During the process of the cover 20 combining with the main case 10, the column portion 24 of the cover 20 also approaches and presses the spring leaf structure 12 of the main case 10; therefore, when the cover 20 is combined with the main case 10, the spring leaf structure 12 is in a elastic deformation state.

On the other hand, in the state that the cover 20 is combined to the main case 10, when the operating portion 32 is movable by an external force to let the corresponding fastening portion 31 detach from the fastening portion 22, i.e. the corresponding fastening portion 31 and the fastening portion 22 are no longer mutually fastened, then the cover 20 is pushed out of the main case 10 with the elastic restoring force exerted by the spring leaf structure 12 on the column portion 24, so the cover 20 will detach from the main case 10.

Hence, the present invention provides a case structure of an electronic device in which a cover is fixed to the case without using any screw; besides, it is easy to assemble or detach the cover and the main case by using the elastic force formed among the components.

The present invention discloses an electronic device comprising a case, which is implemented based on the case structure as described above and can be fixed to the electronic device without using any screw; furthermore, the case comprises components which are disposed and arranged as described in the specification and will not be further explained.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A case structure of an electronic device, comprising:
   a main case comprising:
     a hollow portion; and
     a spring leaf structure protruding inwardly from a side of the hollow portion;
   a cover for combining with the main case to cover the hollow portion, the cover comprising:
     a body;

a fastening portion;
at least one positioning element, wherein the fastening portion and the at least one positioning element are disposed at two opposite sides of the body respectively; and
a column portion disposed on the body to correspond to the spring leaf structure; and
an elastic driving element movably combining with the main case, the elastic driving element comprising:
a corresponding fastening portion disposed with respect to the fastening portion; and
an operating portion, wherein the operating portion is movable to drive the corresponding fastening portion along with the operating portion;
wherein the cover is combined with the main case by at least one fixing element being fastened to the main case and by the fastening portion being fastened with the corresponding fastening portion; wherein the spring leaf structure is pressed by the column portion to generate an elastic deformation; when the operating portion is activated to let the corresponding fastening portion detach from the fastening portion, then the cover may detach from the main case with an elastic restoring force exerted by the spring leaf structure on the column portion.

2. The case structure of an electronic device as claimed in claim 1, wherein the main case further comprises at least one retaining structure for limiting a moving distance of the elastic driving element.

3. The case structure of an electronic device as claimed in claim 1, wherein the main case further comprises a position limiting structure for limiting a moving direction of the operating portion to prevent an elastic deformation of the operating portion caused by an external force.

4. The case structure of an electronic device as claimed in claim 1, wherein the main case further comprises a plurality of through holes, and the cover further comprises a plurality of hitches; when the cover is combined with the main case, the plurality of hitches is mutually fastened with the plurality of through holes to increase a fix effect between the cover and the main case.

5. The case structure of an electronic device as claimed in claim 1, wherein the main case further comprises a receiving hole disposed correspondingly to the operating portion, so the operating portion may protrude from the main case through the receiving hole.

6. The case structure of an electronic device as claimed in claim 1, wherein the elastic driving element further comprises a first end and a second end both fixed to the main case; the corresponding fastening portion and the operating portion are disposed between the first end and the second end.

7. The case structure of an electronic device as claimed in claim 6, wherein the first end and the second end are hot melted to be fixed to the main case.

* * * * *